US008860141B2

(12) United States Patent
Behrends et al.

(10) Patent No.: US 8,860,141 B2
(45) Date of Patent: Oct. 14, 2014

(54) LAYOUT TO MINIMIZE FET VARIATION IN SMALL DIMENSION PHOTOLITHOGRAPHY

(75) Inventors: Derick Gardner Behrends, Rochester, MN (US); Todd Alan Christensen, Rochester, MN (US); Travis Reynold Hebig, Rochester, MN (US); Michael Launsbach, Rochester, MN (US); Daniel Mark Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 457 days.

(21) Appl. No.: 13/345,439

(22) Filed: Jan. 6, 2012

(65) Prior Publication Data

US 2013/0175631 A1 Jul. 11, 2013

(51) Int. Cl.
*H01L 21/70* (2006.01)
(52) U.S. Cl.
USPC .............. 257/368; 257/E21.19; 257/E27.098; 438/587; 716/122
(58) Field of Classification Search
CPC . H01L 21/28; H01L 21/02678; H01L 21/027; H01L 21/469
USPC .............. 257/368, E27.98, E21.19; 438/587; 716/122
See application file for complete search history.

(56) References Cited

U.S. PATENT DOCUMENTS

| | | | |
|---|---|---|---|
| 5,672,450 A | 9/1997 | Rolfson | |
| 5,923,566 A | 7/1999 | Galan et al. | |
| 6,334,209 B1 | 12/2001 | Hashimoto et al. | |
| 6,730,463 B2 | 5/2004 | Heissmeier et al. | |
| 7,906,253 B2 | 3/2011 | Aton et al. | |
| 2008/0107974 A1 | 5/2008 | Douzaka et al. | |
| 2008/0191211 A1 | 8/2008 | Yano et al. | |

OTHER PUBLICATIONS

Chang et al., "Fast and Efficient Phase Conflict Detection and Correction in Standard-Cell Layouts," IEEE/ACM International iConference on Computer-Aided Design, 2005.
Singh et al., "Layout-Aware Through-Process Circuit Analysis", International Conference on Design & Technology of Integrated Systems in Nanoscale Era, 2007.
Peng et al., "High Performance Source Optimization using a Gradient-Based Method in Optical Lithography," IEEE 11th International Symposium on Quality Electronic Design.

*Primary Examiner* — Elias M Ullah
(74) *Attorney, Agent, or Firm* — Robert R. Williams

(57) ABSTRACT

A semiconductor chip has shapes on a particular level that are small enough to require a first mask and a second mask, the first mask and the second mask used in separate exposures during processing. A circuit on the semiconductor chip requires close tracking between a first and a second FET (field effect transistor). For example, the particular level may be a gate shape level. Separate exposures of gate shapes using the first mask and the second mask will result in poorer FET tracking (e.g., gate length, threshold voltage) than for FETs having gate shapes defined by only the first mask. FET tracking is selectively improved by laying out a circuit such that selective FETs are defined by the first mask. In particular, static random access memory (SRAM) design benefits from close tracking of six or more FETs in an SRAM cell.

3 Claims, 6 Drawing Sheets

Layout of SRAM Cell

Conventiional Layout of SRAM Cell

First Gate Definition Mask For Odd Pitch Shape

Second Gate Definition Mask For Even Pitch Shape

Layout of SRAM Cell

Gate Definition Mask

LAYOUT TO MINIMIZE FET VARIATION IN SMALL DIMENSION PHOTOLITHOGRAPHY

FIELD OF THE INVENTION

This invention relates generally to semiconductor chips, and more specifically to semiconductor chips having extremely small dimensions where more than one mask is required to define shapes on a particular level.

SUMMARY OF EMBODIMENTS OF THE INVENTION

A semiconductor chip typically comprises circuits that rely on tracking between FETs (Field Effect Transistors). Tracking between a first FET and a second FET means that at least some characteristics of the first and second FET on the semiconductor chip will have similar properties. With reference to FIG. 6, a first distribution 601 of Leff1−Leff2 (a difference between Leff (effective channel length) on the first FET and Leff on the second FET) is shown to be relatively broad for non-tracking (or poorly tracking) FETs. A second distribution 602 of Leff1−Leff2 shows a much narrower distribution for FETs having close tracking.

A differential receiver or a differential sense amplifier benefit from close tracking between FETs. Static Random Access Memories (SRAMs) rely on close tracking of FETs in an SRAM cell for proper operation, including ability to write to the SRAM cell and for SRAM cell stability during reads of the SRAM cell.

In advanced photolithography, approximately 14 nm (nanometer) and smaller, dimensions are too small to properly expose shapes or adjacent shapes with a single mask, even using a conventional two-phase mask. Two masks, and possibly more masks in the future, are used to separately expose shapes on a level having very small dimensions. Using two gate definition masks as an example, a first gate definition mask is used to define gate shapes on a pitch that is twice a minimum gate pitch of gates to be defined on the semiconductor chip and will define gates on odd numbered pitches (e.g., 1, 3, 5, 7 and so on). A second gate definition mask is used to define gate shapes also on a pitch that is twice the pitch of gates to be defined on the semiconductor chip, but will define gates on even numbered pitches (e.g., 2, 4, 6, 8 and so on). A gate shape on a semiconductor chip is a shape of a material, such as polysilicon or other suitable gate material that forms an FET gate when intersecting with a source/drain area.

Unfortunately, process variations and exposure variations cause FET effective channel lengths with gates defined on odd numbered pitches to track poorly with FET effective channel lengths with gates defined on even numbered pitches. It is, therefore, an object of embodiments of the invention to place FETs that require close matching to be defined by a single gate definition mask, in a process where a first gate definition mask defines FET gates on odd numbered pitches and a second gate definition mask defines FET gates on even numbered pitches.

BRIEF DESCRIPTION OF THE DRAWINGS

FIG. 5A shows a first two FETs created using a first gate definition mask and a first gate exposure; FIG. 5B shows a second two FETs created using a second gate definition mask and a second gate exposure. FIG. 5C shows the four FETs created.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for layout of FETs (Field Effect Transistors) in modern semiconductor chip technologies having feature sizes of approximately 14 nm (nanometers) or less. Feature sizes on current (22 nm) technology and earlier technologies are capable of being defined with a single mask per layer (e.g., a gate definition mask that defines FET gates). Recent advances in mask technology have pushed optical limits by using techniques such as phase-shift masks that take advantage of interference generated by phase differences to improve image resolution in photolithography. Serifs have been put on mask shapes to enhance image resolution, for example, U.S. Pat. No. 6,214,494 "Serif mask design methodology based on enhancing high spacial frequency contributions for improved printability", issued on Apr. 10, 2001. However, as photolithographic features continue to shrink, engineers are being forced to define shapes using more than one mask per level, such as a level that defines FET gates. For exemplary purposes herein, two masks on a level are shown, but the invention contemplates any number of masks greater than one mask per level.

Figure 6:
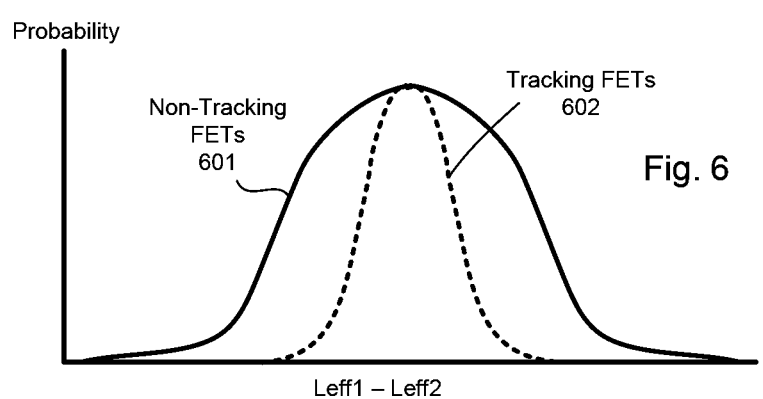
FIG. 6 shows a probability distribution of threshold voltage difference between non-tracking (or poorly tracking) FETs and a probability distribution of threshold voltage difference between close tracking FETs.

Photolithographic exposures using a first exposure with a first mask may vary from a second exposure using a second mask. Statistical process variation in time of exposure or intensity of exposure may cause variation in a shape defined on a process level in the first exposure using the first mask and a second shape defined in the second exposure using the second mask. Therefore, for example, FET gate lengths and Vts (FET threshold voltage) will track more closely for FETs having their gates defined by a single gate definition mask. FET tracking, using effective channel length differences between a first FET and a second FET as an exemplary FET tracking characteristic, was discussed earlier with reference to FIG. 6.

Many circuit designs rely on tracking between FETs in a particular circuit. For example, a differential receiver such as is used in a differential amplifier or a differential I/O (Input/Output) circuit rely on tracking between a first FET and a second FET. An SRAM cell comprises a number of FETs (commonly six FETs) that circuit designers rely upon to track closely, for reliable operation of the SRAM cell. An SRAM cell will be used to illustrate embodiments of the invention; however, other circuits that benefit from tracking between FETs are contemplated. Likewise, for exemplary purposes, gate definition masks, which define gates of FETs will be used, although masks for other process masking steps are contemplated. A first gate definition mask will be used to define FET gates on an odd pitch, and a second gate definition mask will be used to define FET gates on an even pitch.

Figure 1B:
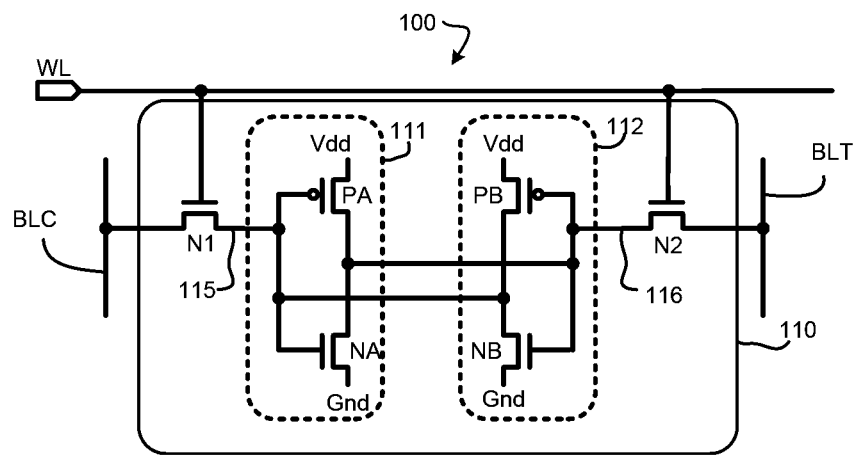
FIG. 1B a schematic of an SRAM (Static Random Access Memory) Cell.
Figure 1A:
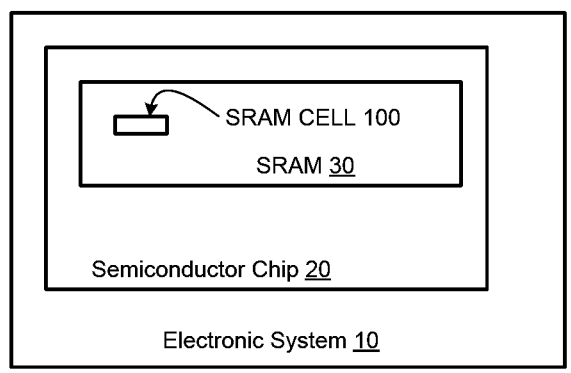
FIG. 1A shows a block diagram of an electronic system having a semiconductor chip; the semiconductor chip comprising an SRAM further comprising one or more SRAM cells.

FIG. 1A shows an electronic system 10. Electronic system 10 may be a computer, a PDA (Personal Digital Assistant), or other electronic system. Electronic system 10 comprises a semiconductor chip 20 having dimensional ground rules that require two (or more) gate definition masks to define FET gates at a minimum pitch. Semiconductor chip 20 may be a processor chip, an ASIC (Application Specific Integrated Chip), or other semiconductor chip that further comprises an SRAM. Semiconductor chip 20 is shown to further comprise an SRAM 30. SRAM 30 further comprises one or more SRAM cells 100. In many SRAMs 30, thousands or millions of SRAM cells 100 are created. It will be understood that while SRAM cells are used for exemplary purposes, other circuits that benefit from close tracking are contemplated.

Figure 2A:
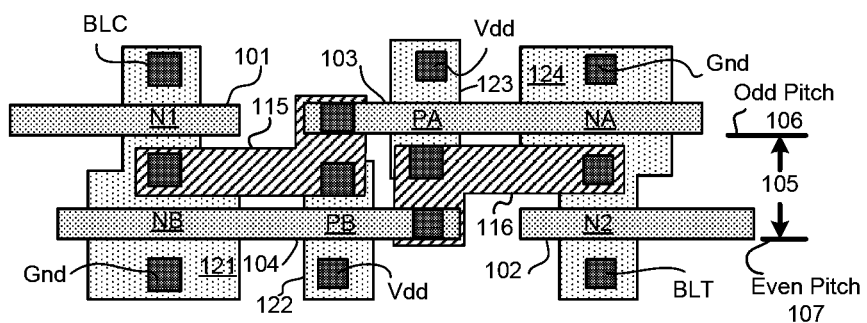
FIG. 2A shows a prior art physical layout of the SRAM cell having the schematic of FIG. 1B.
Figure 2B:
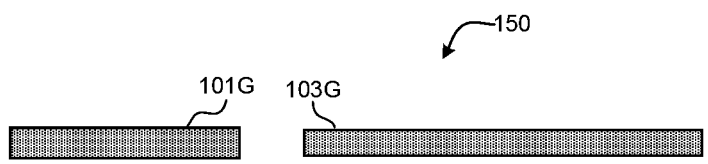
FIG. 2B shows a prior art first gate definition mask used to define three of the FETs of the schematic of FIG. 1B.
Figure 2C:
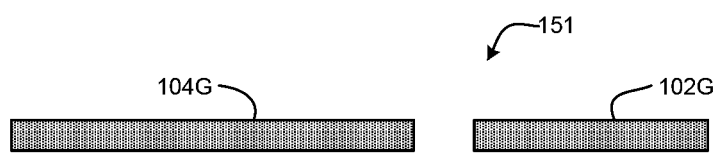
FIG. 2C shows a prior art second gate definition mask used to define another three of the FETs of the schematic of FIG. 1B.
Figure 3A:
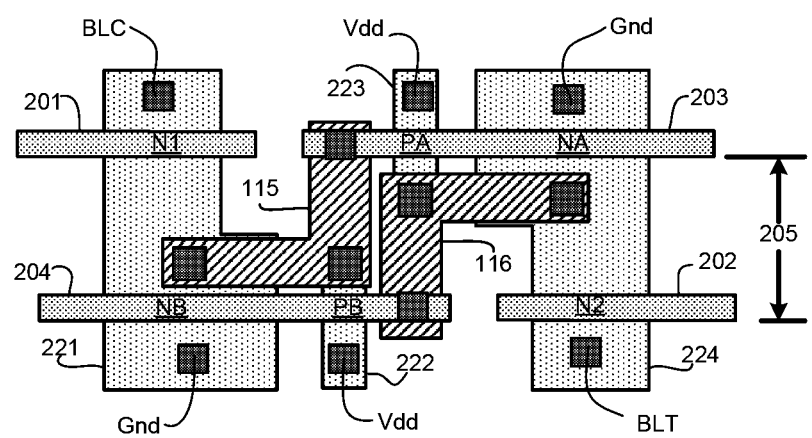
FIG. 3A shows a layout of the schematic of the SRAM cell of FIG. 1B according to embodiments of the invention.
Figure 3B:
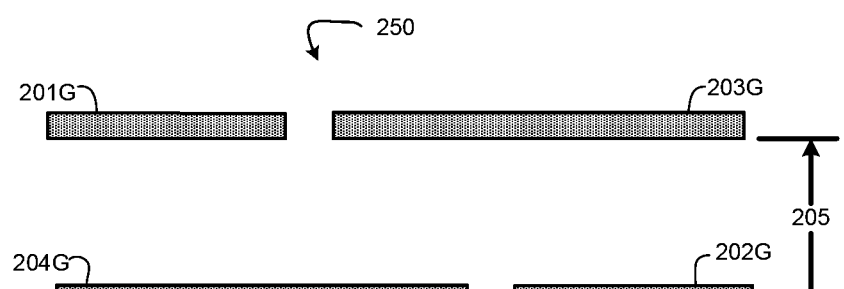
FIG. 3B shows a first gate mask used to define the six FETs of the schematic of FIG. 1B.

FIG. 1B shows an exemplary six transistor (FET) SRAM cell 100 suitable for novel layout as shown in FIGS. 3A, 3B and description thereof. SRAM cell 100 may also be laid out in a conventional layout as shown in FIGS. 2A, 2B, 2C with poorer tracking.

SRAM cell 100 is comprised of pass gate NFETs (N-channel Field Effect Transistor) N1 and N2 and cross-coupled inverters 111 and 112. Inverter 111 further comprises PFET (P-Channel Field Effect Transistor) PA and NFET NA, as shown. Inverter 112 further comprises PFET PB and NFET NB as shown. N1 and N2 are turned on when word line WL is driven "high" (such as to Vdd or other voltage suitable for turning N1 and N2 on). When WL is "high", nodes 115 and 116 are connected to BLC (Bit Line Complement) and BLT (Bit Line True) through N1 and N2, respectively. During a write, BLC and BLT are driven to opposite logical voltages (e.g., Vdd and Gnd) by a bit line driver; the bit line driver and N1, N2 must be of low enough impedance during a write that a logical state of the cross coupled inverters 111, 112 can be changed. For example, if node 115 is at Gnd and node 116 is at Vdd, during a write where BLC is at Vdd and BLT is at Gnd, the bit line driver and N1 have to pull node 115 up, overcoming NB; node 116 must be pulled down through the bit line driver and N2, overcoming PA. Tracking is relied on to allow FETs to be as small as possible. For example, extremely large N1, N2 would make overcoming inverters 111, 112 easier, but at the cost of area on the chip. Word line boost circuitry to increase conductance of N1, N2 during writes is known but at the cost of bootstrapping circuitry or an additional voltage supply.

Another concern of SRAM designers is stability during reads. During a read, both BLC and BLT are precharged high and either BLC or BLT, depending on data stored in SRAM cell 100, are to be pulled down by inverter 111 or 112 after precharge and upon rise of the word line. Again assuming a cell design using very large N1, N2 pass gates, capacitance on BLT, BLC that is charged to Vdd may upset a logical state of the SRAM cell when the word line rises. Suppose that node 115 is held at Gnd by NB when the word line WL is raised, and N1 is very large. NB must hold node 115 low enough to maintain the logical state of SRAM cell 100 while pulling BLC, through N1, low enough for a sense amplifier to recognize that the precharged voltage on BLC has been reduced. Therefore, it is critical that N1 track NB. Similar explanations for tracking between other FETs in SRAM cell 100 are known to those of ordinary skill in the art.

With reference now to FIGS. 2A, 2B, and 2C, a conventional layout of SRAM cell 100 is depicted with enough detail to illustrate problems that arise when a first gate definition mask and a second gate definition mask are used to define FET gates. "Defining an FET" will be used herein to describe defining of FET gates by a gate definition mask. Shape of a FET gate (effective channel length and Vt) is critical in performance of an FET. N1, N2, PA, PB, NA, NB refer to FETs illustrated in FIG. 1B. Gate shape 101 defines N1 where gate shape 101 crosses source/drain area 121. Gate shape 103 defines PA and NA where gate shape 103 crosses source/drain areas 123 and 124 respectively. Gate shape 104 defines NB and PB where gate shape 104 crosses source/drain areas 121 and 122, respectively. Gate shape 102 defines N2 where gate shape 102 crosses source/drain area 124.

As shown, minimum gate pitch is as defined by minimum gate pitch 105 which is a technology limited minimum gate pitch; however, as noted, gates at minimum gate pitch 105 can not be defined, using a single gate definition mask, in a technology having very small (as noted approximately 14 nm and smaller) minimum dimensions.

To create gate shapes at minimum gate pitch 105, gate shapes created at larger pitches must be interdigitated, using multiple gate definition masks and multiple exposures.

Gate shapes 101 and 103 are defined using a first gate definition mask to define gates on odd pitches 106. Gate shapes 102 and 104 are defined using a second gate definition mask to define gates on even pitches 107. When defining very small shapes and spacings, a single gate definition mask can not define gate shapes having a minimum gate pitch 105. Nodes 115 and 116 are shown in FIG. 2A and correspond to nodes 115 and 116 of FIG. 1B, as do all same-named references. Dark square contacts are shown to facilitate understanding of interconnections. Vdd, Gnd, BLC and BLT are shown connected to appropriate square contacts shown by dark squares. Square contacts also show connections of source/drain areas to nodes 115, 116 which may be metal interconnections.

FIG. 2B shows gate mask shapes 101G and 103G on a first gate definition mask 150 to define gate shapes 101 and 103. First gate definition mask 150 is a first mask used for gate definition in the layout of FIG. 2A. FIG. 2C shows gate mask shapes 102G and 104G, to define gate shapes 102 and 104, on a second gate definition mask 151, a second mask used for gate definition in the layout of FIG. 2A. It will be understood that the first and second mask may define millions or even billions of other gate shapes on the semiconductor chip as well as those shown in FIGS. 2B and 2C.

"Track closely" herein means that two FETs will track as well as a given technology specifies tracking when FETs are defined by the same mask.

"Poorer tracking" herein means tracking between FETs on the same semiconductor chip, but not defined by the same gate definition mask.

N1, PA, and NA (FIG. 2A) are defined by the same gate definition mask 150 and will track closely. Likewise, N2, PB, and NB (FIG. 2A) are defined by the same gate definition mask 151, and will track closely. However, poorer tracking will occur between N1 and NB or PB; and poorer tracking will occur between N2 and PA or NA because of separate exposures using separate gate definition masks.

Having reference now to FIGS. 3A and 3B, a novel layout is shown which provides close tracking between all six FETs in SRAM cell 100 at a small increase in area required to lay out SRAM cell 100. The small increase in area is pessimistically about 35%, using equal FET sizes. However, in the conventional layout shown in FIGS. 2A, 2B, 2C, gates may have to be designed larger to make a writeable, stable, SRAM cell 100. Although FET gates in FIG. 3A have twice the pitch of FET gates in FIG. 2A, the novel layout of SRAM cell 100 does not double, since source/drain area 221 "above" (as shown in FIG. 3A) gate shape 201 and "below" gate shape 204 on source/drain area 221 do not change from the conventional layout in FIG. 2A.

Gate shapes for FETs that require close tracking are laid out at pitch 205, which is twice minimum gate pitch 105 so that all FETs in SRAM cell 100 are defined using a single gate definition 250 mask shown in FIG. 3B. Gate shape 201 defines N1 where gate shape 201 crosses source/drain area 221. Gate shape 203 defines PA and NA where gate shape 203 crosses source/drain areas 223 and 224, respectively. Gate shape 202 defines N2 where gate shape 202 crosses source/drain area 224. Gate shape 204 defines NB and PB where gate shape 204 crosses source/drain areas 221 and 222, respectively. All six FETs in SRAM cell 100 must track closely in order to support ability to write data in SRAM cell 100 and for cell stability during a read of data in SRAM cell 100.

FIG. 3B shows a single gate definition mask 250 having gate mask shapes that define all six FET (N1, N2, NA, NB, PA, PB) gates in SRAM cell 100 in the novel layout of FIG. 3A.

It will be understood that while single gate definition mask 250 includes gate mask shapes 201G, 202G, 203G and 204G to define gate shapes 201, 202, 203, and 204 in a particular SRAM cell 100 on a semiconductor chip, gate definition mask 250 may define many other gate shapes on semiconductor chip 20. Likewise, a second gate definition mask 251 (second gate definition mask 251 shown in FIG. 5B) may define gate shapes for six FETS in a second instance of SRAM cell 100, as well as gate shapes for FETs in other circuits on the semiconductor chip. It will also be appreciated that in circuits where close tracking is not critical, such as inverters, NANDs, and NORs, such circuits may be conventionally defined using some gate shapes from the first gate definition mask 250 and some gate shapes from the second gate definition mask 251.

Figure 5A:
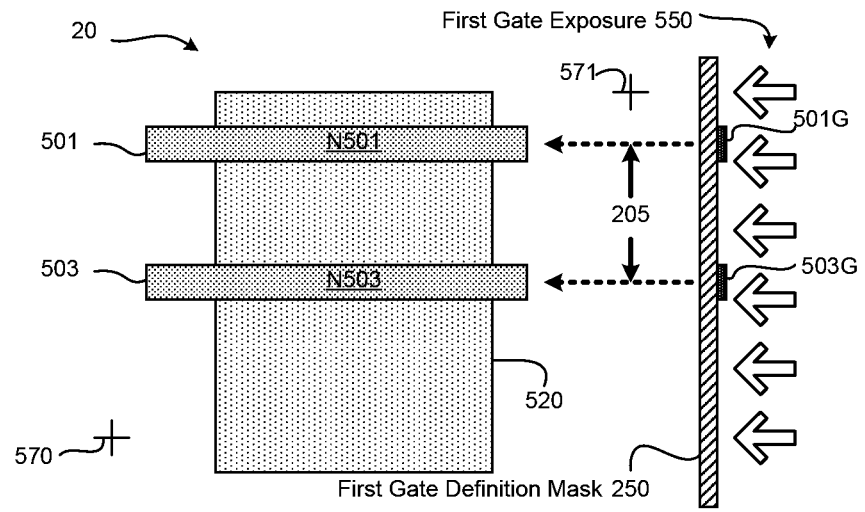
FIGS. 5A, 5B, and 5C show a portion of a semiconductor chip having a plurality of FETs created.
Figure 5B:
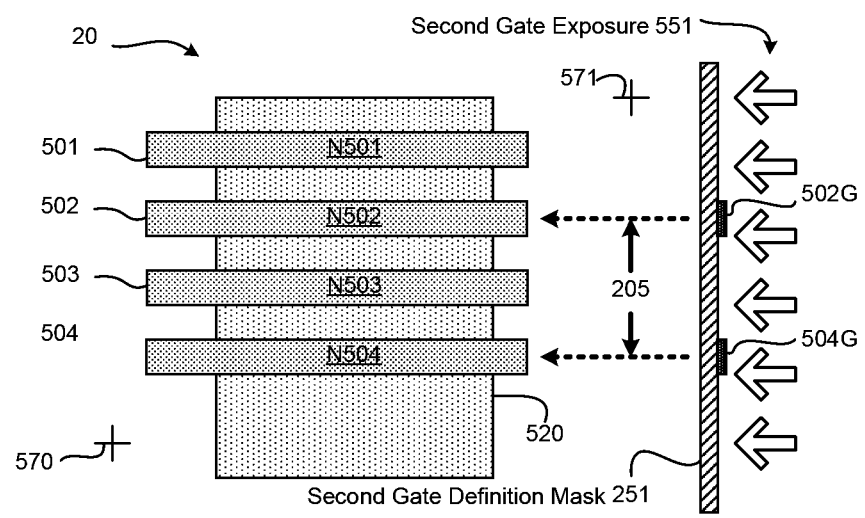
Figure 5C:
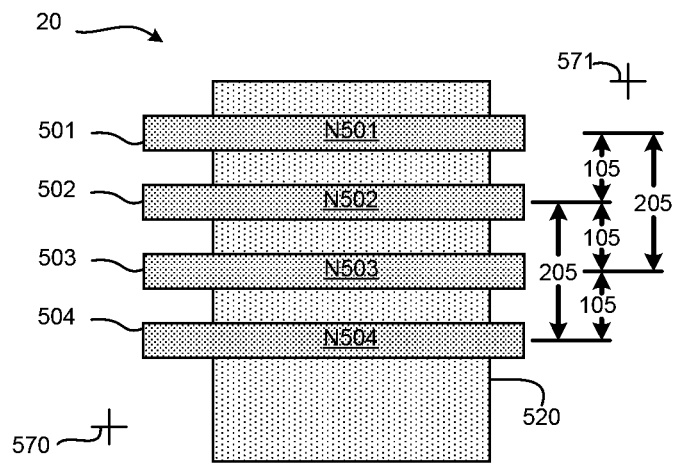

With reference now to FIGS. 5A, 5B, and 5C, semiconductor chip 20 comprises a source/drain area 520, suitable, when properly doped through diffusion or implantation, for FET source/drain areas. Source/drain area 520 may be defined in some technologies using a RX (recessed oxide) shape.

FIG. 5A shows gate shape 501, with FET N501 formed at the intersection of gate shape 501 and source/drain area 520. Gate shape 503 defines FET N503 where gate shape 503 intersects source/drain area 520. A first exposure 550, using first gate definition mask 250, which contains gate mask shapes 501G and 503G, defines gate shapes 501 and 503 at pitch 205 which is the tightest pitch possible, using a single mask, in the technology having minimum feature sizes of approximately 14 nm and smaller as explained earlier. In such a technology, single mask minimum gate pitch is approximately 152 nm. Registration marks 570 and 571 are used to register first gate definition mask 250.

FIG. 5B shows gate shapes 502 and 504, which define FET N502 and FET N504 at intersections with silicon area 520 (gate shapes 501 and 503, created previously as shown in FIG. 5A are also shown in FIG. 5B). Second gate definition mask 251, having gate definition shapes 502G and 504G, is used with second gate exposure 551 to define gate shapes 502 and 504 at pitch 205. Again, registration marks 570 and 571 are used to register second gate definition mask 251 such that gate shapes 501, 502, 503, and 504 are at a minimum pitch for the technology, in this exemplary case, half the pitch of gate shapes defined by first gate definition mask 250 or second gate definition mask 251. In other words, even numbered gate shapes are "interdigitated" between odd gate shapes.

FIG. 5C shows gate shape 501 to gate shape 502 at a minimum gate pitch 105; gate shape 502 to gate shape 503 at minimum gate pitch 105; gate shape 503 to gate shape 504 at minimum gate pitch 105. Gates shapes created by a same gate definition mask (i.e., first gate definition mask 250 or second gate definition mask 251) are at pitch 205, which is twice the minimum gate pitch 105. As an example, a current 14 nm technology allows a 76 nm minimum gate pitch 105; with gate shapes 501 and 503 being at a 152 nm pitch 205 and gate shapes 502 and 504 being at a 152 nm pitch 205.

Figure 4:
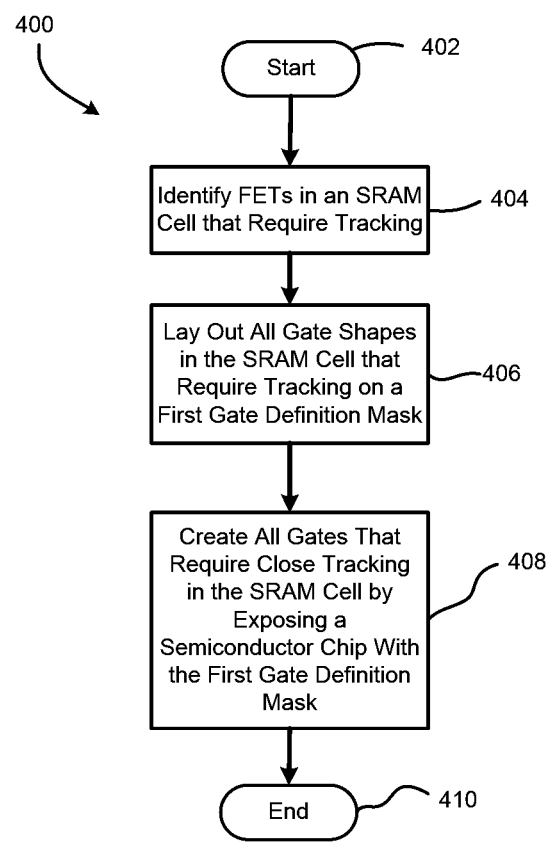
FIG. 4 shows a flow chart illustrating a method embodiment of the invention.

FIG. 4 shows a method 400 embodiment of the invention. Method 400 teaches how, on a semiconductor chip that requires a first gate definition mask to define a first group of FET shapes and a second gate definition mask define a second group of FET gate shapes, to create an SRAM cell where all FETs in the SRAM cell that are required to closely track do track closely.

Method 400 begins at block 402. In block 404, FETs in an SRAM cell (such as SRAM cell 110, FIG. 1) that must closely track are identified. In the specific SRAM cell 100 of FIG. 1, all FETs in SRAM cell 110 must closely track. In block 406, all gate shapes that must track in the SRAM cell are laid out. In block 408, all gates of the identified FETs that must track closely are created by exposing the semiconductor chip with the first gate definition mask. Block 410 ends method 400.

It will be understood that in current or future photolithographic technology, masks other than gate definition masks may require more than one mask to define shapes. Depending on tracking requirements, similar layout techniques apparent to one of ordinary skill in the art with reference to the examples given herein for gate definition masks can be applied to improve tracking of a first FET with a second FET on a semiconductor chip.

What is claimed is:

1. A method for improving tracking between FETs (Field Effect Transistor) in an SRAM (Static Random Access Memory) cell on a semiconductor chip produced in a process having a photolithography limitation of 14 nm or smaller minimum feature size requiring a first gate definition mask to define a first set of gates shapes on a gate shape level and a second gate definition mask to define a second set of gate shapes on the gate shape level, the second set of gate shapes interdigitated with the first set of gate shapes on the gate shape level to produce gate shapes on the gate shape level at a minimum pitch supported by the 14 nm photolithography process comprising:
   the method comprising:
   identifying all FETS in the SRAM cell that require close tracking in FET characteristics; and
   laying out the SRAM cell such that all the FETs identified as requiring close tracking are defined by the first gate definition mask on the gate shape level.

2. The method of claim 1, the SRAM comprising six FETs that must track closely;
   the laying out of the circuit comprising defining gates of all six FETs by the first gate definition mask.

3. A method of processing a semiconductor chip comprising a static random access memory (SRAM) further comprising an SRAM cell comprising:
    creating a first gate definition mask to define six FET gates on a gate shape level in the SRAM cell;
    creating a second gate definition mask to define a seventh FET on the gate shape level;
    exposing the semiconductor chip using the first gate definition mask to create the six FET gates in the SRAM cell; and
    exposing the semiconductor chip using the second gate definition mask to create the seventh FET;
    wherein the processing the semiconductor chip is done by a 14 nm or smaller minimum feature size photolithographic process.

* * * * *